United States Patent
Oh et al.

(10) Patent No.: US 7,597,177 B2
(45) Date of Patent: Oct. 6, 2009

(54) ULTRASONIC/ELECTROMAGNETIC NON-CONTACT BUTTONS/SWITCHES FOR ELEVATORS

(75) Inventors: Jae-Hyuk Oh, Tolland, CT (US); Alberto Vecchiotti, Middletown, CT (US); John Milton-Benoit, Springfield, MA (US); Pei-Yuan Peng, Ellington, CT (US); Norbert A. M. Hootsmans, S. Glastonbury, CT (US)

(73) Assignee: Otis Elevator Company, Farmington, CT (US)

( * ) Notice: Subject to any disclaimer, the term of this patent is extended or adjusted under 35 U.S.C. 154(b) by 496 days.

(21) Appl. No.: 10/590,922

(22) PCT Filed: Feb. 27, 2004

(86) PCT No.: PCT/US2004/005905

§ 371 (c)(1),
(2), (4) Date: Aug. 25, 2006

(87) PCT Pub. No.: WO2005/093708

PCT Pub. Date: Oct. 6, 2005

(65) Prior Publication Data

US 2008/0084382 A1 Apr. 10, 2008

(51) Int. Cl.
*G09G 5/00* (2006.01)
*B66B 3/00* (2006.01)

(52) U.S. Cl. .................. 187/395; 187/391; 345/175; 345/177

(58) Field of Classification Search ........... 187/247, 187/248, 391–395, 413, 414; 250/221, 222.1; 340/541, 545.3, 555–557; 345/175, 177; 341/26

See application file for complete search history.

(56) References Cited

U.S. PATENT DOCUMENTS

| | | | | |
|---|---|---|---|---|
| 4,716,992 A | * | 1/1988 | Kunii | 187/395 |
| 5,679,934 A | * | 10/1997 | Juntunen et al. | 187/395 |
| 6,161,654 A | * | 12/2000 | Sirigu et al. | 187/391 |
| 6,550,586 B1 | * | 4/2003 | Takeuchi | 187/391 |
| 6,690,363 B2 | | 2/2004 | Newton | |
| 7,380,641 B2 | * | 6/2008 | Dos Santos | 187/395 |

FOREIGN PATENT DOCUMENTS

| | | |
|---|---|---|
| JP | 63005289 A | 11/1988 |
| JP | 6186330 A | 8/1994 |
| JP | 8047041 A | 2/1996 |
| JP | 8114666 A | 5/1996 |

* cited by examiner

*Primary Examiner*—Walter Benson
*Assistant Examiner*—Eduardo Colon-Santana
(74) *Attorney, Agent, or Firm*—Bachman & LaPointe, P.C.

(57) ABSTRACT

A method of providing non-contact data selection, comprising the steps of providing at least one data selection, transmitting at least one signal in proximity to the at least one data selection, altering the path of the at least one transmitted signal through interaction with a selection device, detecting at least one altered signal, and determining selection of the selection device from the at least one altered signal.

10 Claims, 1 Drawing Sheet

ULTRASONIC/ELECTROMAGNETIC NON-CONTACT BUTTONS/SWITCHES FOR ELEVATORS

BACKGROUND OF THE INVENTION (1) Field of the Invention

The invention relates to an apparatus and method for providing non-contact data selection. More particularly, the invention relates to using ultrasonic and electromagnetic signals in a non-contact manner to detect the position of a selection device and to correlate such a position to a data selection.

(2) Description of the Related Art

The advent of the outbreaks of potentially dangerous diseases, such as SARS, serves to raise concern regarding the potential transmission of diseases via contact with surfaces routinely used by the public, such as elevator buttons. In the case of SARS outbreaks in Asia, building managers in China covered elevator call buttons with cellophane wrap which was removed and replaced every hour in order to minimize potential widespread infection of building occupants. In addition, there exists a general aversion by certain populations to touch public use surfaces as they are often times regarded as unsanitary and conducive to the transmission of germs and other diseases.

What is therefore needed is an apparatus, and method for using such apparatus, to allow for the non-contact activation of a data selection, such as the buttons of an elevator, activated to select a desired floor destination.

SUMMARY OF THE INVENTION

Accordingly, it is an object of the present invention to provide an apparatus and method for providing non-contact data selection. More particularly, the invention relates to using ultrasonic and electromagnetic signals in a non-contact manner to detect the position of a selection device and to correlate such a position to a data selection.

In accordance with the present invention, a method of providing non-contact data selection, comprises the steps of providing at least one data selection, transmitting at least one signal in proximity to the at least one data selection, altering the path of the at least one transmitted signal through interaction with a selection device, detecting at least one altered signal, and determining selection of the selection device from the at least one altered signal.

In further accordance with the present invention, a non-contact data selection system comprises at least one data selection, means for transmitting a plurality of signals in proximity to the plurality of data selections, means for receiving at least one of the plurality of signals has been altered, means for determining a position of a selection device from the at least one of the altered signals, and means for correlating the position of the selection device to the at least one data selection.

The details of one or more embodiments of the invention are set forth in the accompanying drawings and the description below. Other features, objects, and advantages of the invention will be apparent from the description and drawings, and from the claims.

BRIEF DESCRIPTION OF THE DRAWINGS

Like reference numbers and designations in the various drawings indicate like elements.

DETAILED DESCRIPTION

It is therefore a teaching of the present invention to provide an apparatus, and method for using such an apparatus, to provide for the non-contact activation of a data selection. In each embodiment, at least one signal emitter and one signal receiver associated with at least one data selection, such as a button, is utilized to determine a user's activation of a data selection in a non-contact manner. In the instance in which the signal emitted from the signal emitter and received by the signal receiver is an electromagnetic signal, the present invention operates to detect a blockage or alteration of the signal between the signal emitter and the signal receiver. By arranging an array of signal emitters and signal receivers about a data selection field, such blockage or blockages of one or more emitted signals can be processed to determine the position of a data selector, typically a finger or a hand, in proximity to a data selection field. In the instance wherein the signal emitted from the signal emitter and received by the signal receiver is acoustic, it is possible to determine the duration of time which passes between the emission of a signal and the reflection of a signal back to a signal receiver, from three or more signal emitter/signal receiver pairs so as to determine in three dimensional space the position of a data selector off which the signals are reflected. From such a determination of the position of the data selector in three dimensional space, it is therefore possible to deduce a data selection desired to be activated within the data selection field.

There is further taught the use of either a pair of acoustic emitters and receivers or an acoustic transducer to perform non-contact data selection. In such case, the pair or the transducer detects reflected signals and deduces a data selection based on the magnitude of the reflected signal.

Figure 1:
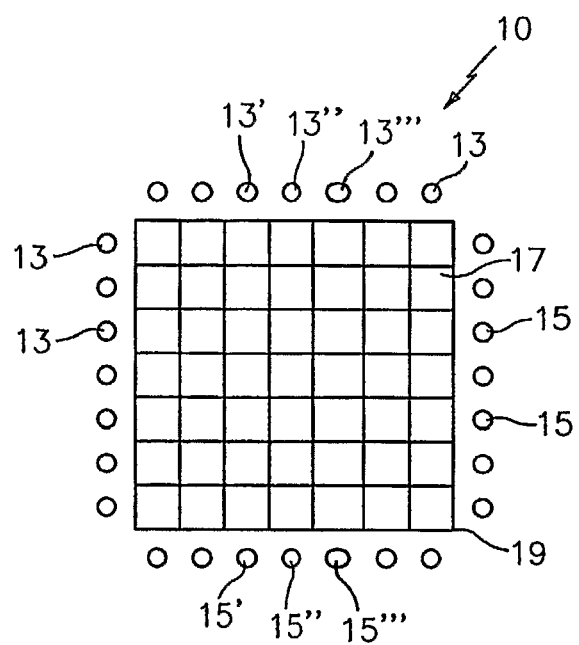
FIG. 1 is a diagram of an embodiment of the non-contact data selection system of the present invention utilizing a plurality of electromagnetic signal emitters.

With reference to FIG. 1, there is illustrated an embodiment of the non-contact data selection system 10 of the present invention. Data selection field 19 is comprised of numerous data selections 17 arrayed in a grid-like pattern. Each data selection 17 represents a discrete choice which may be activated using a data selector 31 as explained more fully below. Each data selection 17 may correlate, for example, to a floor in a building which a user wishes to select in order to guide the conveyance of an elevator. Arrayed about and in proximity to data selection field 19, are opposing arrays of signal emitters 13, and signal receivers 15. By "in proximity" it is meant that the signal emitters 13 and signal receivers 15 are arranged to emit and receive signals generally over or in front of data selection field 19 at a distance not greater than one meter. In a preferred embodiment, there is a single signal receiver 15 situated so as to correspond with single signal emitter 13. Signal emitters 13 emit a signal comprised of electromagnetic energy. In a preferred embodiment, the signals are comprised of infrared pulses emitted by light emitting diodes (LED). However, the present invention is broadly drawn to encompass any and all electromagnetic signals which may be emitted from the signal emitter 13 and received by a signal receiver 15. As noted above, in the present example, each signal emitter 13 possesses a corresponding signal receiver 15. For example, signal emitter 13' directs its signal to signal receiver 15'. Similarly, signal emitters 13" and 13'" emit their signals predominantly towards signal receivers 15" and 15'", respectively. In the present example, two sets of signal emitters 13 and signal receivers 15 are arrayed, one horizontally and one vertically, about data selection field 19.

Because each signal emitter 13 is configured to aim its emission of electromagnetic energy at a single signal receiver 15, the intensity of the signal received by the corresponding signal receiver 15 is largely dependent upon the degree to which, if any, the expanse between a signal emitter 13 and its corresponding signal receiver 15, is obstructed. While the signal emitted from each signal emitter 13 is preferably concentrated so as to fall predominantly upon a single signal receiver 15, in operation it is likely that a small amount of the signal emitted from each signal emitter 13 will strike a signal receiver 15 adjacent to the signal receiver 15 at which the signal is aimed.

Figure 3:
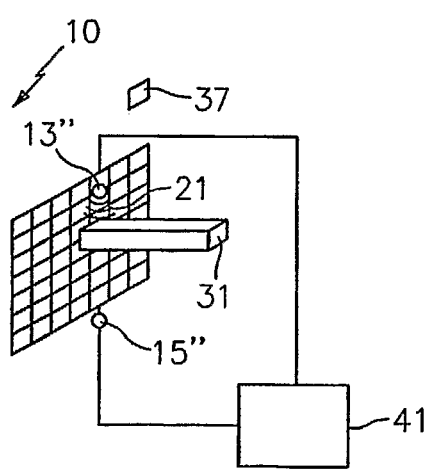
FIG. 3 is a diagram of the embodiment of FIG. 1 in operation.

With reference to FIG. 3, there is illustrated a non-contact input device 10 of the present invention in proximity to a data selector 31. Data selector 31 is any physical object placed in proximity to a data selector 31 sufficiently close to block at least one signal emitted from a signal emitter 13 towards a signal receiver 15. As illustrated, the signal 21 emitted from signal emitter 13" is partially blocked in its path to signal receiver 15". As a result, the intensity of the signal 21 recorded by signal receiver 15" experiences a diminution in intensity. This diminution in intensity is sensed by processor 41.

Processor 41 is any form of computer or electronic device capable of activating the signal emitters 13 to emit signals 21, detecting the receipt of such signals by the signal receivers 15, and computing a position of the data selector and a corresponding data selection therefrom. Processor 41 receives information on the intensity of signals received by each signal receiver 15, as well as instructs each signal emitter 13 when to emit a signal 21. As noted above, each signal 21 emitted from a signal emitter 13 will most likely emit a portion of the signal to more than one signal receiver 15. As noted, while a single signal receiver 15 will receive a predominant amount of the signal 21 aimed at it by corresponding signal emitter 13, the signal receivers 15 adjacent to the signal receiver 15 corresponding to the signal emitter 13 generating the signal 21 will receive amounts of signal 21 dissipating in a generally Gaussian manner as the distance of adjacent signal receivers 15 increase away from a signal receiver 15 to which signal 21 is directed. As a result, placing a data selector 31 in such a way as to block a portion of a signal emitted from a signal emitter 13 to a signal receiver 15, often times results in a pattern of diminution of received signal strength across a plurality of signal receivers 15. Processor 41 can interpolate or average the signals across a plurality of signal receivers 15 receiving a signal 21. Through such a process of averaging or interpolation, processor 41 is able to determine precisely where across the expanse of arrayed signal receivers 15 and signal emitters 13 the data selector 31 is located. As signal emitters 13 and signal receivers 15 are arrayed both horizontally and vertically, it is possible therefore for processor 41 to determine the position of data selector 31 both horizontally and perpendicularly so as to identify a single point on data selection field 19 corresponding to a horizontal and vertical position of data selector 31. Specifically, having determined the horizontal and vertical position of data selector 31, processor 41 can correlate the position of data selector 31 to a single data selection 17.

In a preferred embodiment, not all of the signal emitters 13 are activated at the same time. Rather, signal emitters 13 are activated in rapid succession, preferably progressing both horizontally and vertically until each signal emitter 13 has been activated, at which point the process is repeated. By performing this action in rapid succession, all of the signal emitters 13 arranged horizontally, as well as those arranged vertically, are repeatedly activated in sequence to identify the position of a data selector 31 and the corresponding data selection 17. To further minimize the amount of energy transmitted by the signal emitters 13, the activation sequence of the signal emitters 13 is not begun until a data selector 31 in proximity to the data selection field 19 is sensed or otherwise activated. In one embodiment, a proximity detector 37 is utilized to activate the non-contact selection system 10 in the presence of a data selector 31. The proximity detector 37 may be comprised of a signal emitter and a signal receiver similar or identical to the signal emitters 13 and signal receivers 15 comprising the non-contact system detector 10 of the present invention. In operation, proximity detector 37 repeatedly emits electromagnetic or ultrasonic signals 21 while detecting any reflections of such signals indicating the presence of a body or object in front of data selection field 19. While such body is detected, the non-contact selection system 10 of the present invention is activated. Likewise, when proximity detector 37 detects that the body has left the vicinity of data selection field 19, the non-contact data selection system 10 of the present invention is deactivated.

Figure 2:
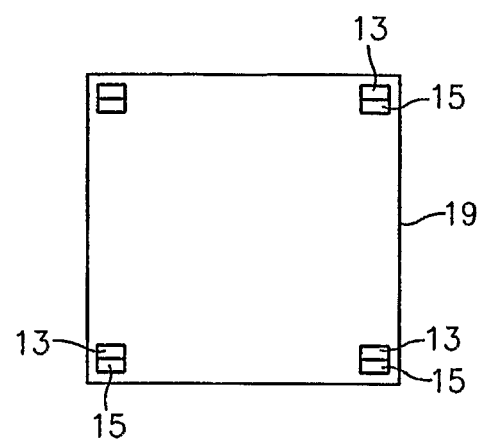
FIG. 2 is a diagram of an embodiment of the non-contact selection system of the present invention utilizing a plurality of ultrasonic signal emitters.
Figure 4:
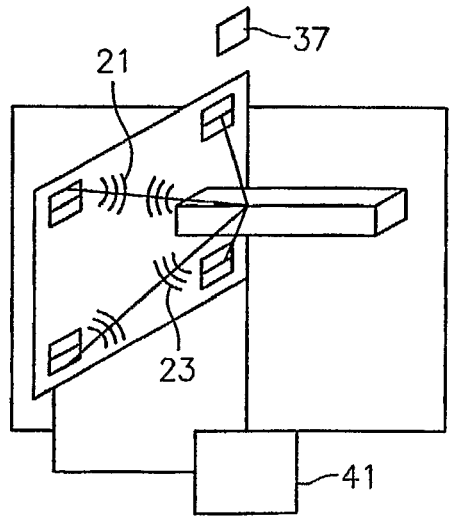
FIG. 4 is a diagram of the embodiment of FIG. 2 in operation.

With reference to FIG. 2, there is illustrated an alternative embodiment of the present invention. As illustrated, at least three, preferably four groupings, each group consisting of a signal emitter 13 and a signal receiver 15, are located about the periphery of a data selection field 19. Each of the several signal emitters 13 is configured to emit a signal having a frequency unique from those of all other signal emitters 13. In such an instance, the signal is an ultrasonic signal comprised of sound waves. With reference to FIG. 4, there is illustrated the method by which the position of data selector 31 is ascertained. Each signal emitter 13 emits a signal of a specific frequency. In addition, a signal receiver 15 corresponding to each signal emitter 13 listens for reflected sound waves. As illustrated, sound waves 21 emanate from each signal emitter 13 and are reflected by data selector 31 as reflections 23. Once a signal receiver receives a reflection 23 of a frequency corresponding to the signal receiver's 15 corresponding signal emitter 13, it communicates with processor 41 to indicate the receipt of such a reflection 23. Processor 41, is responsible for activating each signal emitter 13 and therefore records the time at which a signal emitter 13 emits its signal 21 of a unique frequency. When processor 41 is alerted with the reception of a reflection 23 by a signal receiver 15, processor 41 computes a time interval separating the emission of a signal 21 from a signal emitter 13 and its reception via signal receiver 15 of its corresponding reflection 23. Knowing this time interval and the speed of sound, processor 41 is able to compute a distance of data selector 31 from each signal receiver 15 receiving a reflection. In the instance that at least three such reflections are received, processor 41 can compute in three dimensional space a position of the data selector 31 either in front of or behind data selection field 19. In the instance where four signal emitters 13 are employed, the position of data selector 31 may be computed more precisely in three dimensional space. Then having determined the position and three dimensional space of data selector 31, processor 41 can correlate the position of data selector 31 to the data selection 17 residing most closely to a position on data selection field 19.

In an alternative embodiment, a single grouping is installed in a button or area serving as a data selection 17. When a signal is emitted from the signal emitter 13 of the grouping and reflected to the signal receiver 15 of the grouping, processor 41 detects the presence of a data selector 31, and hence, selection of the data selection 17.

In both embodiments discussed thus far, it is possible that as data selector 31 moves across data selection field 19, numerous determinations of its position will be generated from its movement. In a preferred embodiment, processor 41 is programmed to determine a number of positions of data selector 31 and to note the amount of time elapsing between each position. Processor 41, in addition, does not determine a final position of data selector 31, until data selector 31 has maintained a nearly identical position over a set period of time. By "nearly identical position" it is meant that the data selection corresponding to the determined position of data selector 31 does not change. In a preferred embodiment, such a period of time is preferably between one twentieth of a second and one half second. Most preferably, this period of time is approximately 0.1 second.

One or more embodiments of the present invention have been described. Nevertheless, it will be understood that various modifications may be made without departing from the spirit and scope of the invention. Accordingly, other embodiments are within the scope of the following claims.

What is claimed is:

1. A method of providing non-contact data selection, comprising the steps of:
    providing at least one data selection;
    transmitting a plurality of signals in proximity to said plurality of data selections;
    said transmitting step comprising transmitting a plurality of acoustic signals from at least three groupings, each of said at least three groupings comprising a signal emitter for emitting one of said plurality of acoustic signals of a unique frequency and a signal receiver for receiving one of said plurality of acoustic signals;
    altering the path of at least one of said transmitted plurality of acoustic signals through interaction with a selection device;
    detecting at least one of said altered plurality of acoustic signals;
    determining a position of said selection device from said at least one of said altered plurality of acoustic signals; and
    correlating said position of said selection device to said at least one data selection.

2. The method of claim 1 wherein said altering step comprises reflecting each of said plurality of acoustic signals off of said selection device for reception by one of said plurality of signal receivers.

3. The method of claim 1 wherein said determining step comprises measuring an amount of time between the emission of each of said plurality of acoustic signals and reception by said plurality of signal receivers, converting said amounts of time to a plurality of distances, and using said plurality of distances to locate said selection device.

4. The method of claim 1 wherein said providing said at least one data selection comprises providing said at least one data selection on an elevator.

5. A method of providing non-contact data selection, comprising the steps of:
    providing at least one data selection;
    providing a data selector in proximity to a data selection field;
    detecting the proximity of said data selector to said data selection field with a proximity detector;
    activating a non-contact selection system comprising a plurality of signal emitters and a plurality of signal receivers when said data selector is detected;
    said activating step comprising sequentially transmitting a plurality of signals in proximity to said plurality of data selections;
    said transmitting step comprising sequentially emitting a plurality of electromagnetic signals from said signal emitters each aimed at a corresponding one of said signal receivers;
    altering the path of at least one of said transmitted plurality of signals through interaction with said data selector;
    said altering step comprising partially blocking said path of at least one of said plurality of electromagnetic signals;
    detecting at least one of said altered plurality of signals;
    said detecting step comprising measuring an intensity of each of said electromagnetic signals at each of said plurality of signal receivers;
    determining a position of said selection device from said at least one of said altered plurality of signals;
    correlating said position of said data selector to said at least one data selection; and
    deactivating said non-contact selection system when said proximity detector has detected that said data selector has left the vicinity of the data selection field.

6. The method of claim 5 wherein said providing said at least one data selection comprises providing said at least one data selection on an elevator.

7. A non-contact data selection system comprising:
    at least one data selection;
    means for transmitting a plurality of signals in proximity to said plurality of data selections;
    said transmitting means comprising means for transmitting a plurality of acoustic signals from at least three groupings, each of said at least three groupings comprising a signal emitter for emitting one of said plurality of acoustic signals of a unique frequency and a signal receiver for receiving one of said plurality of acoustic signals;
    means for altering the path of at least one of said transmitted plurality of acoustic signals through interaction with a selection device;
    means for detecting at least one of said altered plurality of acoustic signals;
    means for determining a position of said selection device from said at least one of said altered plurality of acoustic signals; and
    means for correlating said position of said selection device to said at least one data selection.

8. The system of claim 7 wherein said at least one data selection corresponds to a floor accessible by an elevator.

9. The system of claim 7 wherein said altering means comprises means for reflecting each of said plurality of acoustic signals off of said selection device for reception by one of said plurality of signal receivers.

10. The system of claim 7 wherein said determining means comprises means for measuring an amount of time between the emission of each of said plurality of acoustic signals and reception by said plurality of signal receivers, means for converting said amounts of time to a plurality of distances, and means for using said plurality of distances to locate said selection device.

* * * * *

UNITED STATES PATENT AND TRADEMARK OFFICE
CERTIFICATE OF CORRECTION

PATENT NO.       : 7,597,177 B2                                    Page 1 of 1
APPLICATION NO.  : 10/590922
DATED            : October 6, 2009
INVENTOR(S)      : Oh et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 538 days.

Signed and Sealed this

Twenty-eighth Day of September, 2010

David J. Kappos
*Director of the United States Patent and Trademark Office*